United States Patent
Gou et al.

(10) Patent No.: US 9,231,610 B2
(45) Date of Patent: Jan. 5, 2016

(54) SAR ANALOG-TO-DIGITAL CONVERTING APPARATUS AND OPERATING METHOD THEREOF AND CMOS IMAGE SENSOR INCLUDING THE SAME

(71) Applicants: SK hynix Inc., Gyeonggi-do (KR); Industry-University Cooperation Foundation Hanyang University, Seoul (KR)

(72) Inventors: Ja-Seung Gou, Gyeonggi-do (KR); Min-Kyu Kim, Seoul (KR); Oh-Kyong Kwon, Seoul (KR)

(73) Assignees: SK Hynix Inc., Gyeonggi-do (KR); Industry-University Cooperation Foundation Hanyang University, Seoul (KR)

( * ) Notice: Subject to any disclaimer, the term of this patent is extended or adjusted under 35 U.S.C. 154(b) by 80 days.

(21) Appl. No.: 14/293,736

(22) Filed: Jun. 2, 2014

(65) Prior Publication Data
US 2015/0146066 A1 May 28, 2015

(30) Foreign Application Priority Data
Nov. 22, 2013 (KR) ........................ 10-2013-0142956

(51) Int. Cl.
*H04N 5/76* (2006.01)
*H04N 3/14* (2006.01)
(Continued)

(52) U.S. Cl.
CPC ................ *H03M 1/18* (2013.01); *H03M 1/468* (2013.01); *H04N 5/378* (2013.01)

(58) Field of Classification Search
CPC ........... H03M 1/38; H03M 1/40; H03M 1/42; H03M 1/44; H03M 1/46; H03M 1/462; H03M 1/464; H03M 1/466; H03M 1/468; H03M 1/442; H03M 1/445; H03M 1/447
USPC .......... 348/291–308, 231.1–231.99; 341/118, 341/161, 172, 155, 158, 145; 250/208.1
See application file for complete search history.

(56) References Cited

U.S. PATENT DOCUMENTS

| | | | |
|---|---|---|---|
| 6,924,760 B1 * | 8/2005 | McLeod | H03M 1/066 341/144 |
| 9,071,265 B1 * | 6/2015 | Dey | H03M 1/0695 1/1 |

(Continued)

FOREIGN PATENT DOCUMENTS

| KR | 1020020014522 | 2/2002 |
|---|---|---|
| KR | 1020100048477 | 5/2010 |

*Primary Examiner* — Chia-Wei A Chen
(74) *Attorney, Agent, or Firm* — IP & T Group LLP

(57) ABSTRACT

A Successive Approximation Register (SAR) analog-to-digital converting apparatus includes a reference voltage supply unit suitable for supplying different reference voltages depending on bits of a pixel output signal to be converted, an N bit SAR analog-to-digital conversion unit suitable for sequentially converting upper N−1 bits and lower N bits of the pixel output signal by selectively using the reference voltages supplied from the reference voltage supply unit, where N is a natural number, and an error correction unit suitable for calculating an error correction value based on a difference between conversion results of the lower N bits, and outputting a 2N−2 bit analog-to-digital conversion result by combining converted upper N−1 bits and converted lower N bits and correcting an error of the reference voltages using the error correction value in the combining.

16 Claims, 14 Drawing Sheets

(51) Int. Cl.
*H04N 5/335* (2011.01)
*H03M 1/12* (2006.01)
*H03M 1/38* (2006.01)
*H03M 1/18* (2006.01)
H03M 1/46 (2006.01)
H04N 5/378 (2011.01)

(56) References Cited

U.S. PATENT DOCUMENTS

| | | | |
|---|---|---|---|
| 2003/0063026 A1* | 4/2003 | Nandy | H03M 1/0854 341/172 |
| 2003/0123646 A1* | 7/2003 | Srinivasan | H03M 1/0697 379/399.01 |
| 2005/0078026 A1* | 4/2005 | Cai | H03M 1/164 341/162 |
| 2008/0036638 A1* | 2/2008 | Suzuki | H03M 1/14 341/155 |
| 2010/0109924 A1* | 5/2010 | Cho | H03M 1/0695 341/118 |
| 2010/0156684 A1* | 6/2010 | Westwick | H03M 1/0636 341/131 |
| 2011/0148682 A1* | 6/2011 | Rigby | H03M 1/183 341/155 |
| 2011/0215956 A1* | 9/2011 | Ishikawa | H03M 1/00 341/110 |
| 2015/0091744 A1* | 4/2015 | Shen | H03M 1/04 341/110 |
| 2015/0188561 A1* | 7/2015 | Narayan | H03M 1/38 341/118 |

* cited by examiner

US 9,231,610 B2

SAR ANALOG-TO-DIGITAL CONVERTING APPARATUS AND OPERATING METHOD THEREOF AND CMOS IMAGE SENSOR INCLUDING THE SAME

CROSS-REFERENCE TO RELATED APPLICATIONS

The present application claims priority of Korean Patent Application No. 10-2013-0142956, filed on Nov. 22, 2013, which is incorporated herein by reference in its entirety.

BACKGROUND

1. Field

Exemplary embodiments of the present invention relate to an image sensor (IS), and more particularly, to a successive approximation analog-to-digital converting apparatus having a high definition property while occupying a small area, an operating method thereof, and a Complementary Metal-Oxide Semiconductor (CMOS) image sensor including the same.

2. Description of the Related Art

A conventional single-slop analog-to-digital convertor (ADC) has low definition properties and long analog-to-digital conversion time when used in a Complementary Metal-Oxide Semiconductor (CMOS) image sensor of a column parallel readout scheme Therefore, a Successive Approximation Register (SAR) analog-to-digital converting apparatus is being researched and developed.

The SAR analog-to-digital converting apparatus has a simple circuit configuration including a capacitor digital-to-analog converter (DAC), a comparator, and an SAR logic unit, and thus it consumes less power. The SAR logic unit may include a Successive Approximation Register (SAM.

In the SA analog-to-digital converting apparatus, however, the area of the capacitor DAC is doubled, as the number of bits to be converted is increased by one bit. To reduce the area of the capacitor DAC when the high-definition SAR analog-to-digital converting apparatus is designed, a method of controlling the level of a reference voltage is suggested.

In the method of controlling the level of the reference voltage, a high level of accuracy for the reference voltage is required to protect an output signal of the SAR analog-to-digital converting apparatus from a nonlinear error.

SUMMARY

An exemplary embodiment of the present invention is directed to a Successive Approximation Register (SAR) analog-to-digital converting apparatus that may control the level of a reference voltage to reduce the area of a capacitor digital-to-analog converter (DAC) by calculating and correcting an error of a generated reference voltage, an operating method thereof, and a Complementary Metal-Oxide Semiconductor (MOS) image sensor using the same.

In accordance with an exemplary embodiment of the present invention, an SAR analog-to-digital converting apparatus includes a reference voltage supply unit suitable for supplying different reference voltages depending on bits of a pixel output signal to be converted, an N bit SAR analog-to-digital conversion unit suitable for sequentially converting upper N−1 bits and lower N bits of the pixel output signal by selectively using the reference voltages supplied from the reference voltage supply unit, where N is a natural number, and an error correction unit suitable for calculating an error correction value based on a difference between conversion results of the lower N bits, and outputting a 2N−2 bit analog-to-digital conversion result by combining converted upper N−1 bits and converted lower N bits and correcting an error of the reference voltages using the error correction value in the combining.

In accordance with another exemplary embodiment of the present invention, a method of operating an SAR analog-to-digital converting apparatus includes sampling a test input voltage using first reference voltages, performing charge redistribution operations through changes in the first reference voltages, converting lower N bits of an output signal of a capacitor DAC to obtain analog-to-digital conversion results using second reference voltages, obtaining an error correction value based on a difference between the analog-to-digital conversion results, and correcting an error of the second reference voltages with the error correction value.

In accordance with yet another exemplary embodiment of the present invention, a CMOS image sensor includes a pixel array suitable for generating a pixel output signal, an SAR analog-to-digital converting apparatus suitable for sequentially converting upper N−1 bits and lower N bits of the pixel output signal by selectively using reference voltages, calculating an error correction value based on a difference between conversion results of the lower N bits, and correcting an error of the reference voltages by combining converted upper N−1 bits and converted lower N bits using the error correction value, and an image signal processor suitable for performing an image signal processing operation on an analog-to-digital conversion result that is outputted from the SAR analog-to-digital converting apparatus.

DETAILED DESCRIPTION

Figure 1:
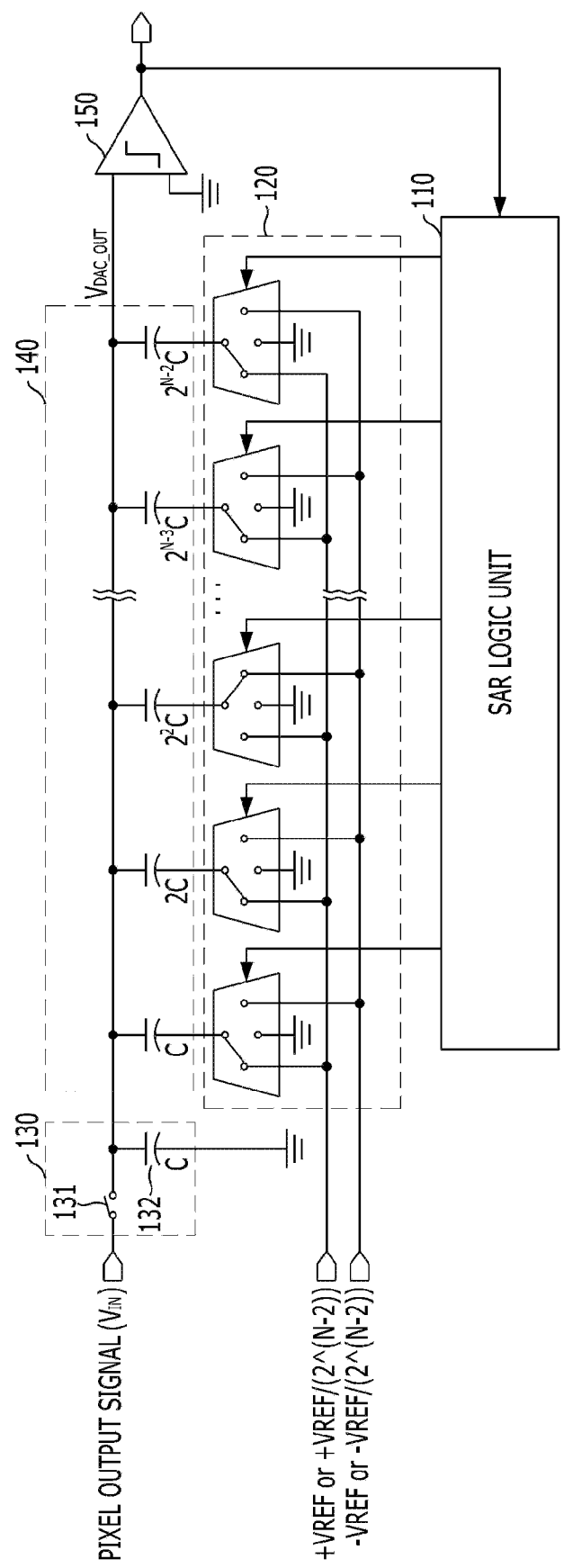
FIG. 1 is a circuit diagram illustrating a 10-bit two-tier Successive Approximation Register (SAR) analog-to-digital converting apparatus to explain the concept of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. When it is considered that detailed description on the widely known technology related to the present invention may blur the point of the present invention unnecessarily, the description is omitted herein.

Throughout the disclosure, when a certain portion is 'connected' to another portion, it means not only a 'direct connection' but also an 'indirect connection' with a yet another portion interposed between them. Also, when a portion 'includes' or 'is formed of' another constituent element, it means that the portion does not exclude the presence of other constituent elements, but may further include or be formed of other constituent elements without being mentioned otherwise. Also, even if some constituent elements are described in a singular form throughout the specification, the scope of the present invention is not limited to it and the described constituent elements may also be provided in plural as well.

FIG. 1 is a circuit diagram illustrating a 10-bit two-tier Successive Approximation Register (SAR) analog-to-digital converting apparatus to explain the concept of the present invention. A case where N is 6 (N=6) is described hereafter as an example.

Referring to FIG. 1, the 10-bit two-tier SAR analog-to-digital converting apparatus includes an SAR logic unit 110, a switch row 120, a sampling unit 130, a capacitor row 140, and a comparison unit 150.

The SAR logic unit 110 is fed back with an output signal of the comparison unit 150 and supplies a control signal based on a predefined SAR logic. The switch row 120 selects a first reference voltage +VREF or +VREF/($2^{(N-2)}$) or a second reference voltage −VREF or −VREF/($2^{(N-2)}$) and transfers the selected reference voltage to the capacitor row 140 in response to the control signal outputted from the SAR logic unit 110. The sampling unit 130 samples a pixel output signal $V_{IN}$ outputted from a pixel array and transfers the sampled signal to the capacitor row 140 in response to a control signal transferred from an external controller (not shown). The sampling unit 130 includes a sampling switch 131 and a sampling capacitor 132. The capacitor row 140 is coupled with the output terminal of the switch row 120 and the output terminal of the sampling unit 130. The comparison unit 150 receives the output $V_{DAC\_OUT}$ of the capacitor row 140, performs a comparison operation, and outputs a comparison result. Herein, the switch row 120, the sampling unit 130, and the capacitor row 140 may constitute a capacitor digital-to-analog converter (DAC).

In the 10-bit two-tier SAR analog-to-digital converting apparatus, a reference voltage VCMP+VREF/16 and a reference voltage VCMP−VREF/16 are used in addition to a reference voltage VCMP (e.g., a ground voltage), a reference voltage VCMP+VREF, and a reference voltage VCMP−VREF to reduce the area of the capacitor DAC 120 to 140.

However, an error may occur in the additionally generated reference voltage VCMP+VREF/16 and the reference voltage VCMP−VREF/6. The error of the reference voltage may cause a nonlinear error of the output signal of the SAR analog-to-digital converting apparatus. This is described in detail below with reference to FIGS. 2 to 4.

Figure 2:
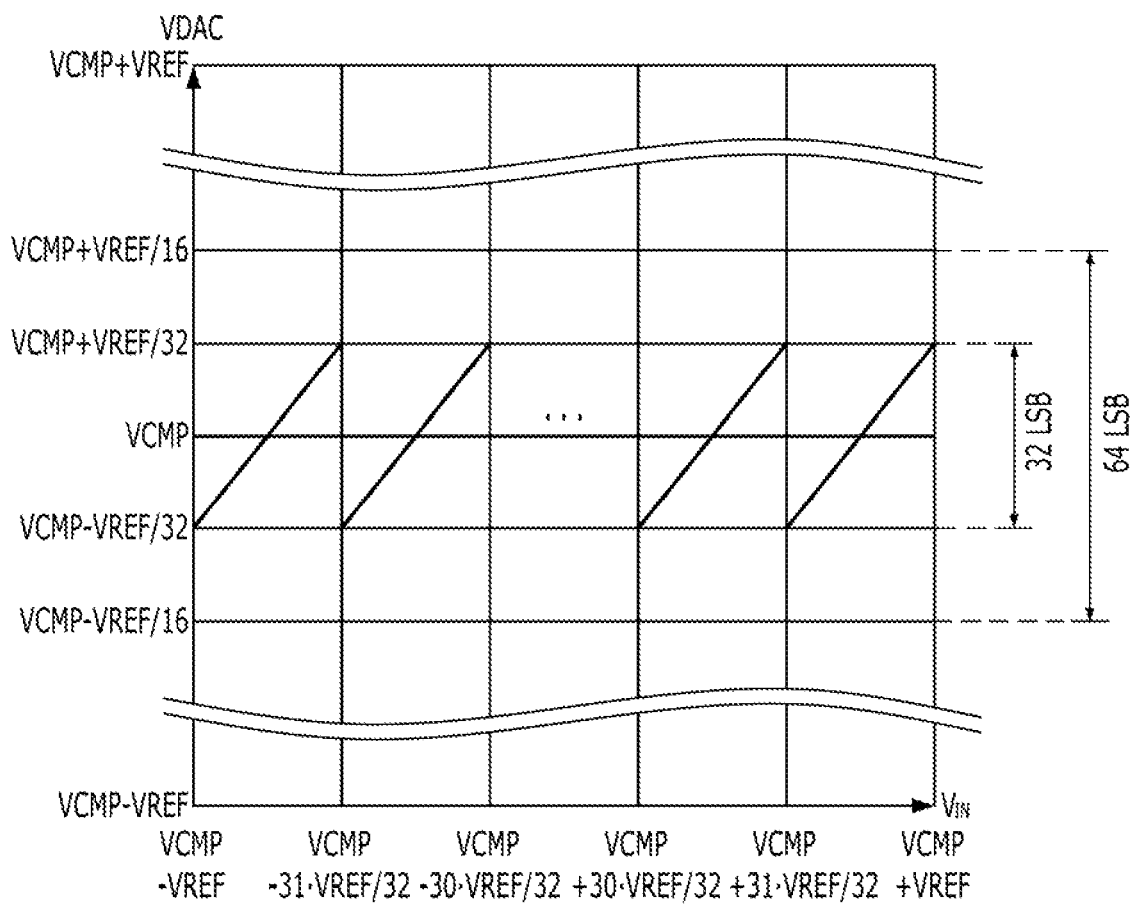
FIG. 2 shows voltages remaining in a capacitor digital-to-analog converter (DAC) of an ideal case after the upper 5 bits are converted to explain the concept of the present invention.

FIG. 2 shows voltages remaining in the capacitor DAC 120 to 140 of an ideal case after the upper 5 bits are converted to explain the concept of the present invention.

Referring to FIG. 2, since the voltages remaining in the capacitor DAC 120 to 140 after the upper 5 bits are converted ideally exist between a voltage VCMP+VREF/32 and a voltage VCMP−VREF/32, the range is as great as VREF/16. This corresponds to 32 Least Significant Bits (LSB) (32=$2^5$).

Therefore, in the ideal case, an error corrector performs a calculation of the following Equation 1 to obtain the final output ADC_OUT_10B of the 10-bit two-tier SAR analog-to-digital converting apparatus.

$$ADC\_OUT\_10B = D\_UPPER\_5B \times 32 + D\_LOWER\_6B \quad \text{Equation 1}$$

Here, 'D_UPPER_5B' denotes the upper 5 bits of the output of the 10-bit two-tier SAR analog-to-digital converting apparatus, and 'D_LOWER_6B' denotes the lower 6 bits of the output of the 10-bit two-tier SAR analog-to-digital converting apparatus.

When an error additionally occurs during the generation of the reference voltages VCMP+VREF/16 and VCMP−VREF/16, the range of the voltages remaining in the capacitor DAC 120 to 140 after the upper 5 bits are converted have another size, which is not 32 LSB.

Figure 3:
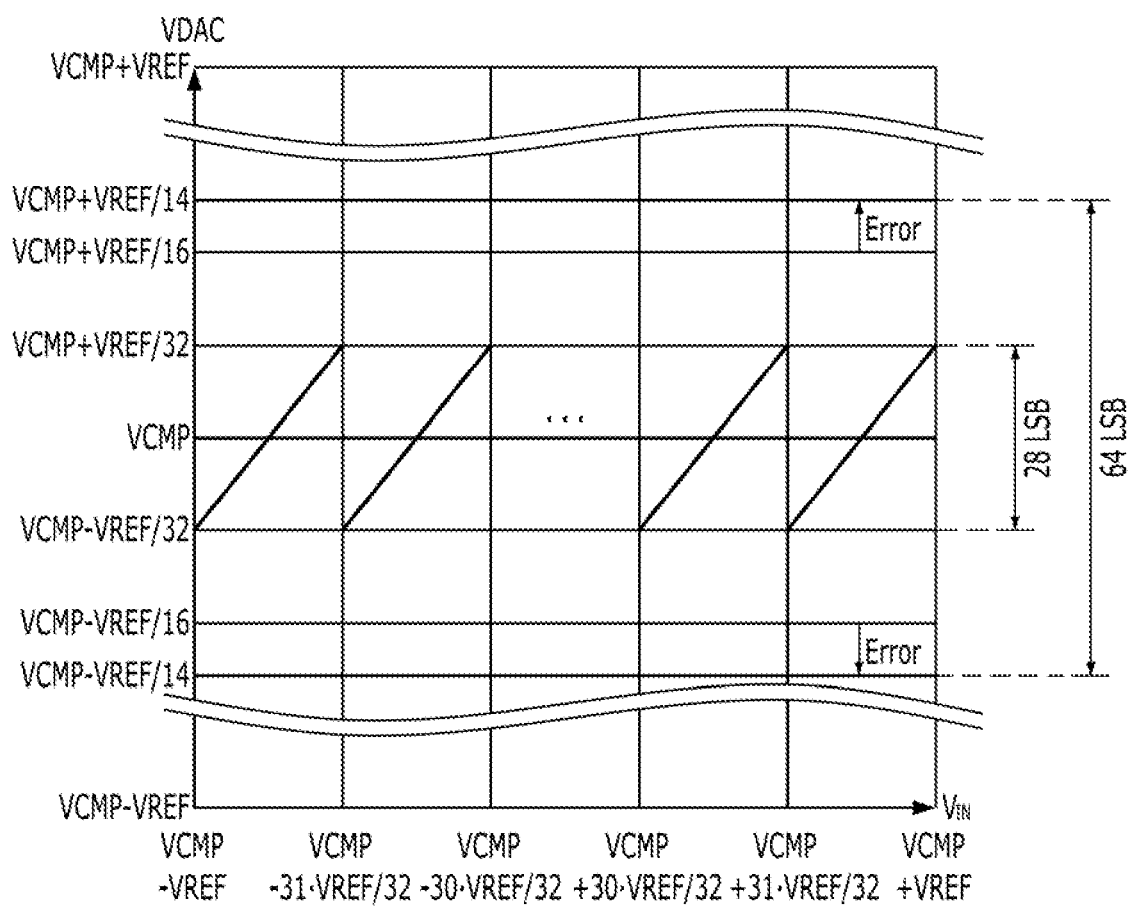
FIG. 3 shows voltages remaining in a capacitor DAC after the upper 5 bits are converted when an error occurs during the generation of reference voltages to explain the concept of the present invention.
Figure 4:
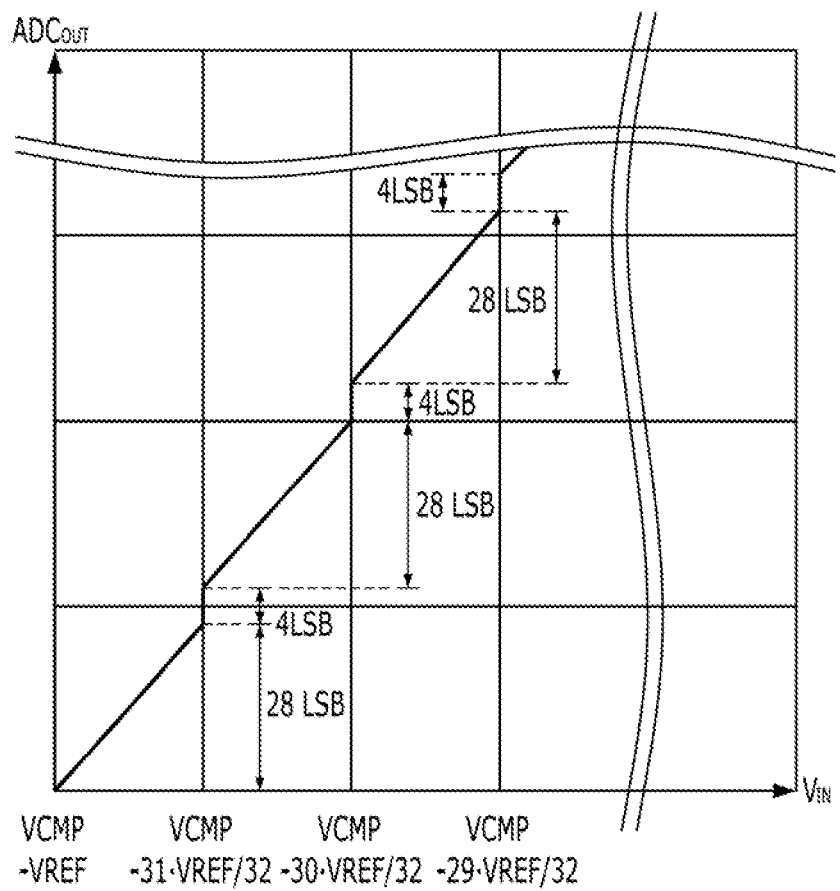
FIG. 4 shows a nonlinear error of an output signal of the SAR analog-to-digital converting apparatus after the upper 5 bits are converted when an error occurs during the generation of reference voltages to explain the concept of the present invention.

FIG. 3 shows voltages remaining in the capacitor DAC 120 to 140 after the upper 5 bits are converted when an error occurs during the generation of the reference voltages to explain the concept of the present invention, and FIG. 4 shows a nonlinear error of an output signal of the SAR analog-to-digital converting apparatus after the upper 5 bits are converted when an error occurs during the generation of the reference voltages to explain the spirit and concept of the present invention.

FIG. 3 shows as an example that a voltage VCMP+VREF/14 and a voltage VCMP−VREF/14 are generated and used in error as the reference voltages VCMP+VREF/16 and VCMP−VREF/16, respectively, in the SAR analog-to-digital converting apparatus. FIG. 4 shows the nonlinear error of the output signal of the SAR analog-to-digital converting apparatus of the case shown in FIG. 3. Herein, the range of the voltages remaining in the capacitor DAC 120 to 140 after the conversion of the upper 5 bits has a size of VREF/16, which is the same as that of the ideal case, but the size of the Least Significant Bit (LSB) becomes different during the conversion of the lower 6 bits due to the error in the reference voltages. The size of the least significant bit is 28 LSB.

For this reason, the nonlinear error of 4 LSB occurs in the output signal of the SAR analog-to-digital converting apparatus, which is obtained based on the above Equation 1, as illustrated in FIG. 4, in a section where the output of the upper 5 bits is changed.

Therefore, the error corrector needs the following Equation 2 in order to obtain the output signal of the SAR analog-to-digital converting apparatus without a nonlinear error in the case of FIG. 2, $$ADC\_OUT\_10B = D\_UPPER\_5B \times 28 + D\_LOWER\_6B \quad \text{Equation 2}$$

To sum up, it is to be calculated what size of the LSB corresponds to the size (which is VREF/16) of the range of the voltages remaining in the capacitor DAC 120 to 140 after the conversion of the upper 5 bits during the conversion of the lower 6 bits in order to remove the nonlinear error from the output signal of the SAR analog-to-digital converting apparatus.

In short, the embodiment of the present invention controls the size of the reference voltages for a high-definition SAR analog-to-digital converting apparatus occupying a small-area by calculating the error of the controlled reference voltages and digitally correcting the error.

Figure 5:
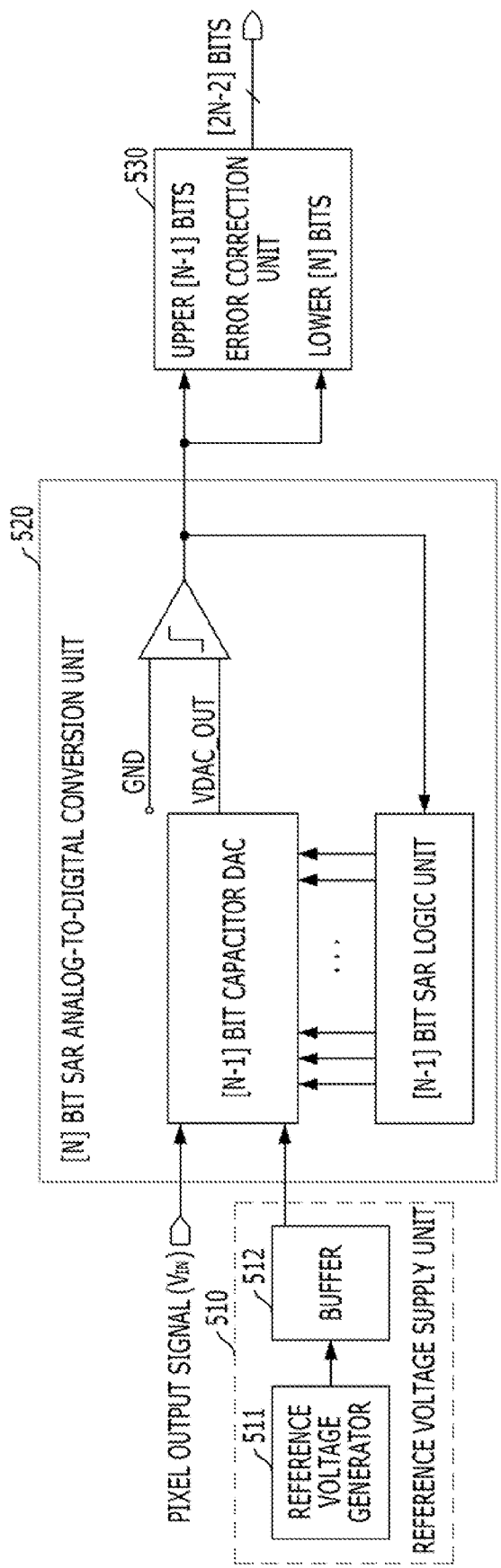
FIG. 5 is a block diagram illustrating an SAR analog-to-digital converting apparatus in accordance with an embodiment of the present invention.

FIG. 5 is a block diagram illustrating an SAP, analog-to-digital converting apparatus in accordance with an embodiment of the present invention.

Referring to FIG. 5, the SAR analog-to-digital converting apparatus in accordance with the embodiment of the present invention includes a reference voltage supply unit 510, an N bit SAR analog-to-digital conversion unit 520, and an error correction unit 530. The reference voltage supply unit 510 supplies different reference voltages depending on the bits of a pixel output signal converted by the N bit SAR analog-to-digital conversion unit 520. The N bit. SAR analog-to-digital conversion unit 520 sequentially converts the upper N−1 bits and the lower N bits of the pixel output signal by selectively using the reference voltages supplied from the reference voltage supply unit 510 and outputs a bit conversion result to the error correction unit 530. The error correction unit 530 calculates an error correction value based on the difference between the lower N bits that are converted in the N bit SAR analog-to-digital conversion unit 520, and corrects the error of the reference voltages by using the obtained error correction value when combining the upper N−1 bits and the lower N bits, which are converted in the N bit SAR analog-to-digital conversion unit 520. The error correction unit 530 finally outputs a 2N−2 bit analog-to-digital A/D) conversion result. Herein, the "N" is a natural number. The internal structure of the N bit SAR analog-to-digital conversion unit 520 is the same as that of FIG. 1 and is to be described in FIGS. 6 to 11

The reference voltage supply unit 510 includes a reference voltage generator 511 and a buffer 512. The reference voltage generator 511 outputs different reference voltages depending on the bits of the pixel output signal converted by the N bit SAR analog-to-digital conversion unit 520. The buffer 512 transfers the reference voltages from the reference voltage generator 511 to the N bit SAR analog-to-digital conversion unit 520.

The N bit SAR analog-to-digital conversion unit 520 couples the lowermost capacitor of a capacitor DAC with a terminal of a voltage VCMP−VREF when sampling a test input voltage (refer to an operation of FIG. 6 described below). Herein, the "VCMP" may be a ground voltage, and the "VREF" may be a reference voltage.

Also, the N bit SAR analog-to-digital conversion unit 520 changes the reference voltage supplied to the capacitor DAC into a voltage VCMP and performs a charge redistribution operation after the sampling of the test input voltage is completed (refer to an operation of FIG. 7 described below).

After the charge redistribution operation is completed, the N bit SAR analog-to-digital conversion unit 520 converts the lower N bits of the output signal of the capacitor DAC (refer to an operation of FIG. 8 described below).

When the test input voltage is sampled, the N bit SAR analog-to-digital conversion unit 520 couples the lowermost capacitor of the capacitor DAC with a terminal of a voltage VCMP+VREF and repeats the operation of converting the lower N bits (refer to operations of FIGS. 9 to 11 described below).

The N bit SAR analog-to-digital conversion unit 520 stores the difference between the conversion results of the lower N bits. The error correction unit 530 reflects the difference between the conversion results to correct the error of the reference voltages when combining the upper N−1 bits and the lower N.

As shown above, the SAR analog-to-digital converting apparatus may calculate the error of the reference voltages and correct the error when the reference voltages of different levels are generated.

Figure 6:
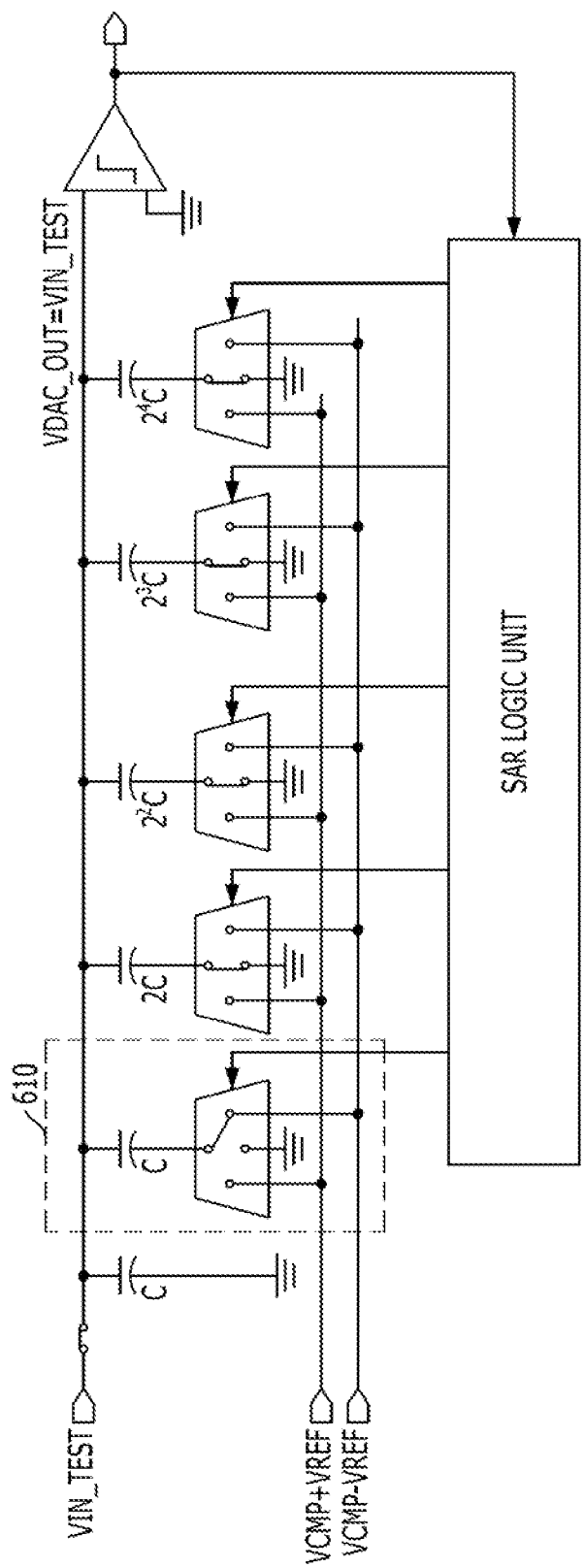
FIG. 6 is a circuit diagram illustrating an SAR analog-to-digital conversion unit which samples a test input voltage in accordance with the embodiment of the present invention.

FIG. 6 is a circuit diagram illustrating the SAR analog-to-digital conversion unit, which samples a test input voltage in accordance with the embodiment of the present invention. The SAR analog-to-digital converting apparatus samples the test input voltage VIN_TEST to calculate the error of the generated reference voltages.

Herein, the bottom end of the lowermost capacitor of the capacitor DAC is coupled with the terminal of the voltage VCMP−VREF, which is different from other capacitors (refer to a reference numeral 610).

Figure 7:
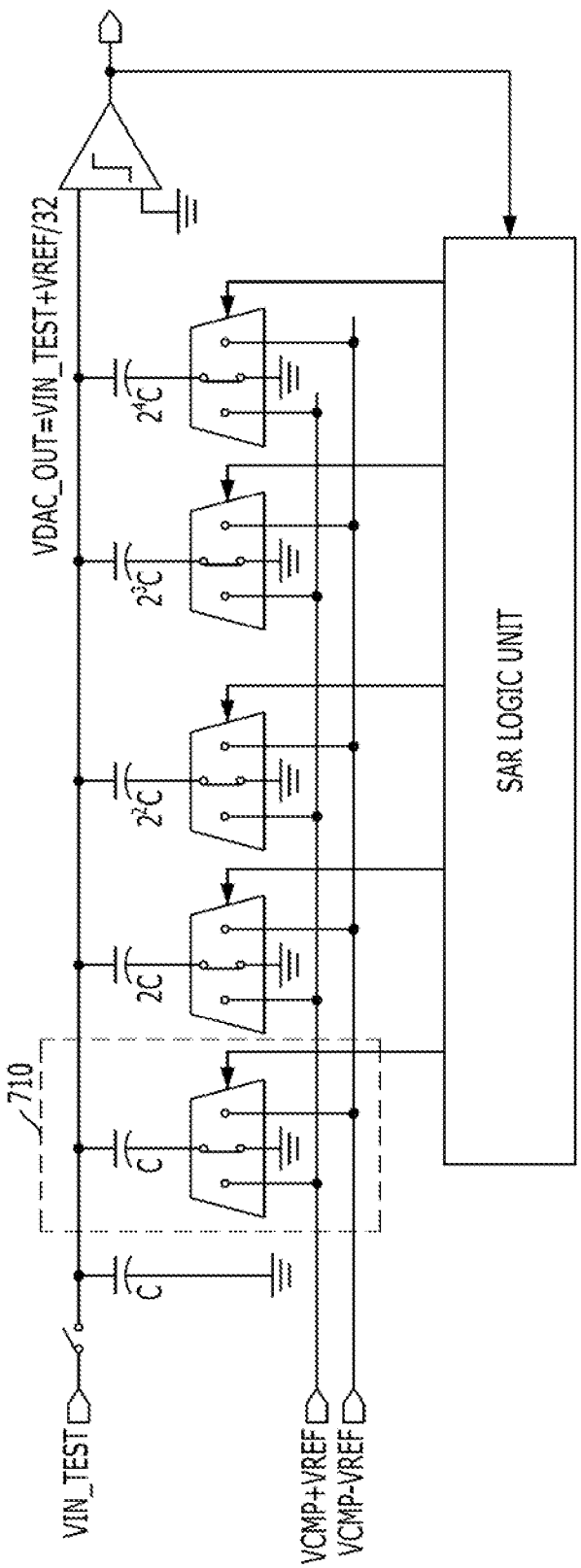
FIG. 7 is a circuit diagram illustrating a charge redistribution operation of the SAR analog-to-digital conversion unit in accordance with the embodiment of the present invention.

FIG. 7 is a circuit diagram illustrating a charge redistribution operation of the SAR analog-to-digital conversion unit in accordance with the embodiment of the present invention. After the sampling operation of FIG. 6, the bottom end of the lowermost capacitor of the capacitor DAC is coupled with the terminal of the voltage VCMP, which is changed from the terminal of the voltage VCMP−VREF (refer to a reference numeral 710). The output signal VDAC_OUT of the capacitor DAC has a value of a voltage VIN_TEST+VREF/32 as a result of the charge redistribution operation that is performed due to the change in the reference voltage.

Figure 8:
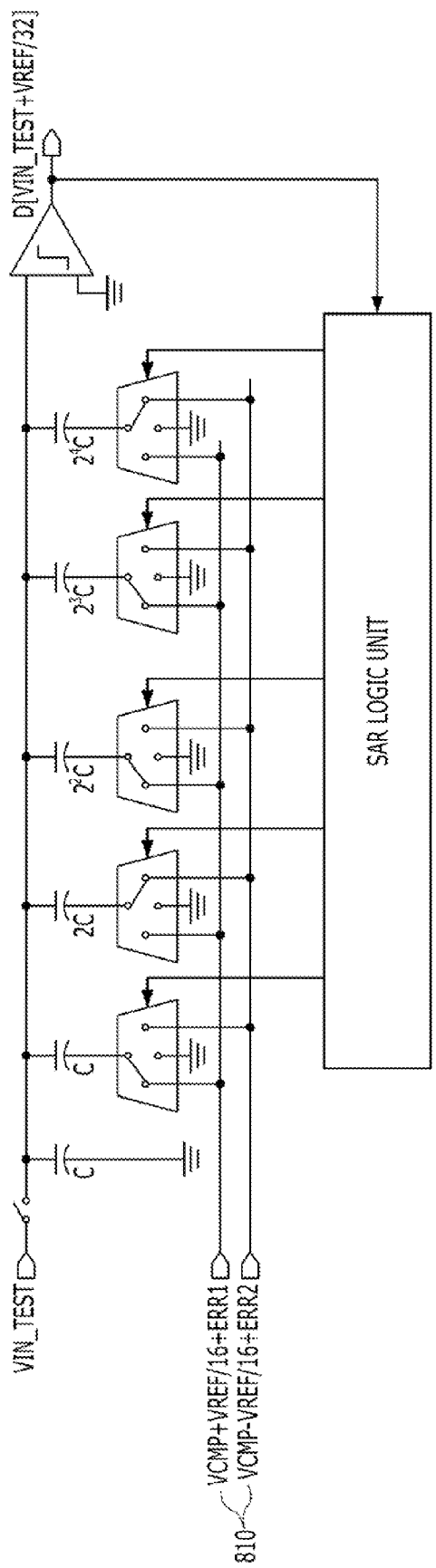
FIG. 8 is a circuit diagram illustrating the SAR analog-to-digital conversion unit, which converts the lower 6 bits of an output signal of a capacitor DAC, in accordance with the embodiment of the present invention.

FIG. 8 is a circuit diagram illustrating the SAR analog-to-digital conversion unit, which converts the lower 6 bits of the output signal of the capacitor DAC in accordance with the embodiment of the present invention. FIG. 8 illustrates the operation of converting the lower 6 bits after the operation of FIG. 7 is completed.

The analog-to-digital (A/D) conversion result of the output signal VIN_TEST+VREF/32 of the capacitor DAC is stored in a value D[VIN_TEST+VREF/32] through the conversion operation of the lower 6 bits. The reference voltages VCMP+VREF/16 and VCMP−VREF/16 that are used for the conversion operation of the lower 6 bits have errors −ERR1 and +ERR2, which occurs during the generation of the reference voltages, respectively (refer to a reference numeral 810). When the output signal VIN_TEST+VREF/32 of the capacitor DAC is smaller than a value VCMP+VREF/16+ERR1, which is obtained by summing the reference voltage and the error occurring during the generation of the reference voltage, it is between values VCMP+VREF/16+ERR1 and VCMP−VREF/16+ERR2, which is the analog-to-digital conversion range of the SAR analog-to-digital converting apparatus during the operation of converting the lower 6 bits. Therefore, the analog-to-digital (A/D) conversion may be performed on the output signal VIN_TEST+VREF/32.

Figure 9:
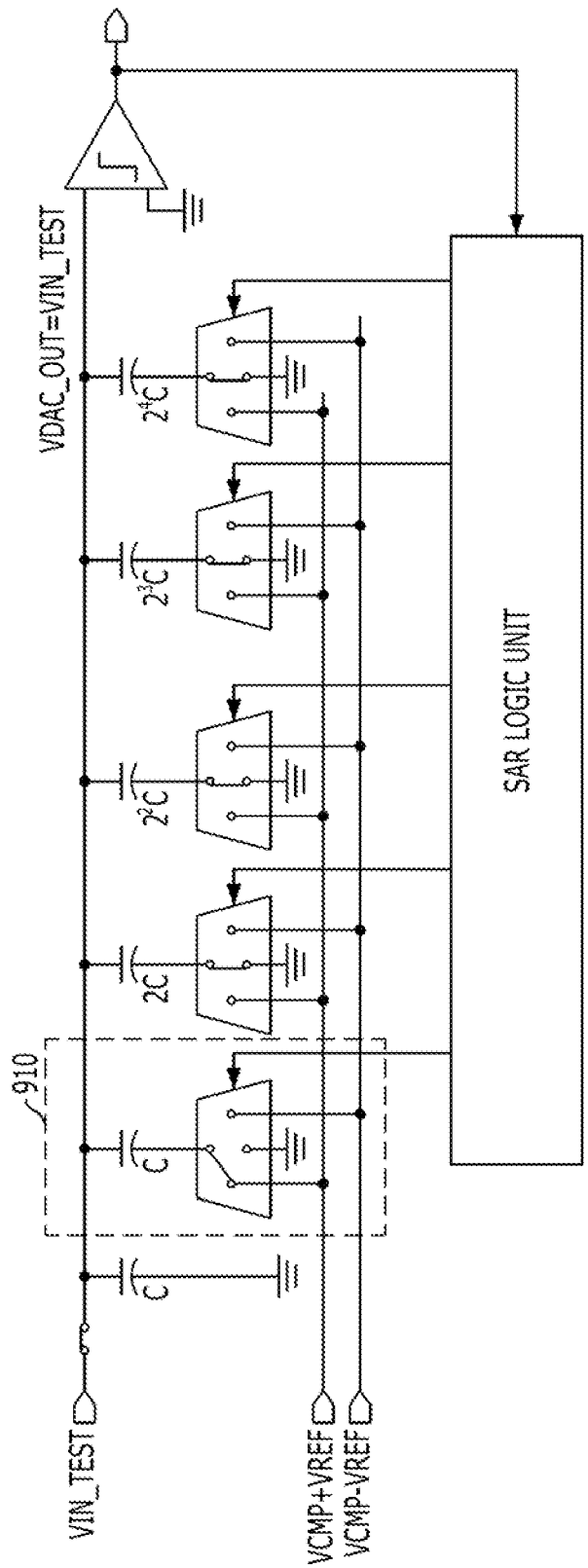
FIG. 9 is a circuit diagram illustrating the SAR analog-to-digital conversion unit, which samples a test input voltage, in accordance with another embodiment of the present invention.

FIG. 9 is a circuit diagram illustrating the SAR analog-to-digital conversion unit, which samples a test input voltage in accordance with another embodiment of the present invention. After the conversion operation of FIG. 8 is completed, the SAR analog-to-digital conversion unit samples the test input voltage VIN_TEST in the similar way shown in FIG. 6.

The sampling operation of FIG. 9 is different from that of FIG. 6 in that the bottom end of the lowermost capacitor of the capacitor DAC is coupled not with the terminal of the voltage VCMP−VREF but with the terminal of the voltage VCMP+VREF (refer to a reference numeral 910).

Figure 10:
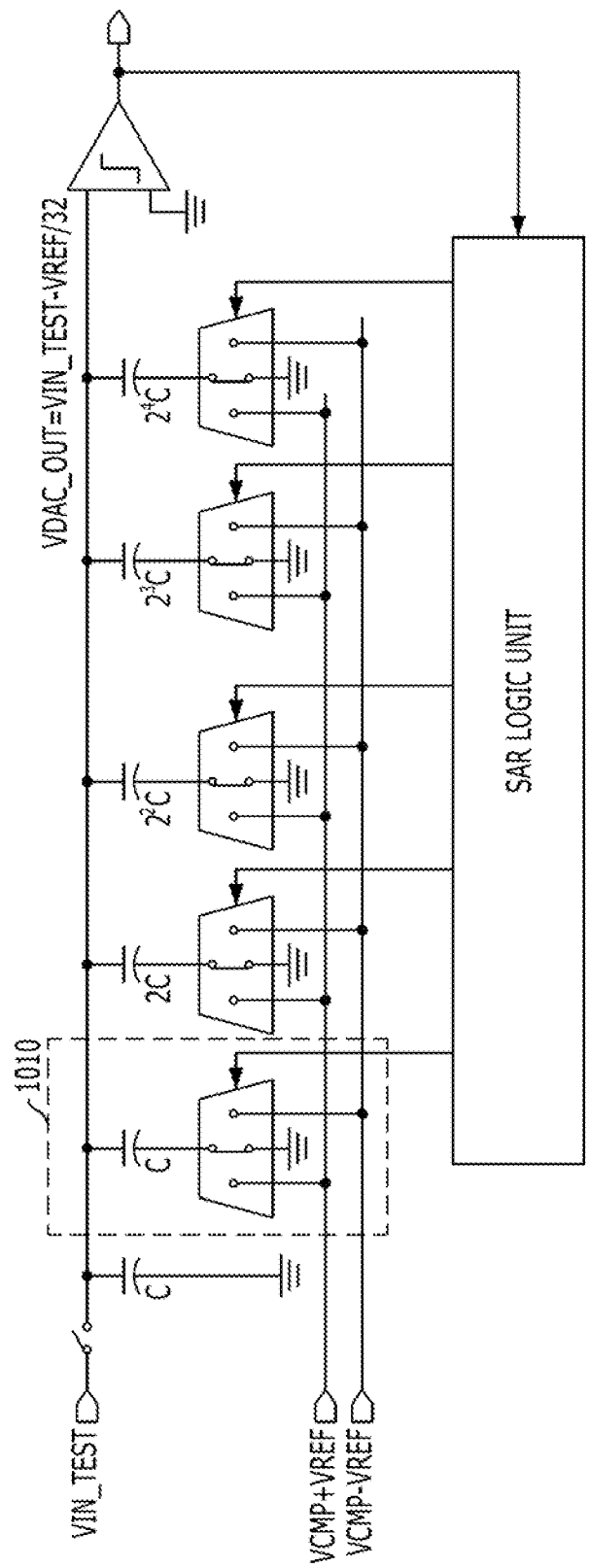
FIG. 10 is a circuit diagram illustrating a charge redistribution operation of the SAR analog-to-digital conversion unit in accordance with the embodiment of the present invention.

FIG. 10 is a circuit diagram illustrating a charge redistribution operation of the SAR analog-to-digital conversion unit in accordance with the embodiment of the present invention. After the sampling operation of FIG. 9, the bottom end of the lowermost capacitor of the capacitor DAC is coupled with the terminal of the voltage VCMP, which is changed from the terminal of the voltage VCMP+VREF (refer to a reference numeral 1010). The output signal VDAC_OUT of the capacitor DAC has a value of a voltage VIN_TEST−VREF/32 as a result of the charge redistribution operation that is performed due to the change in the reference voltage.

Figure 11:
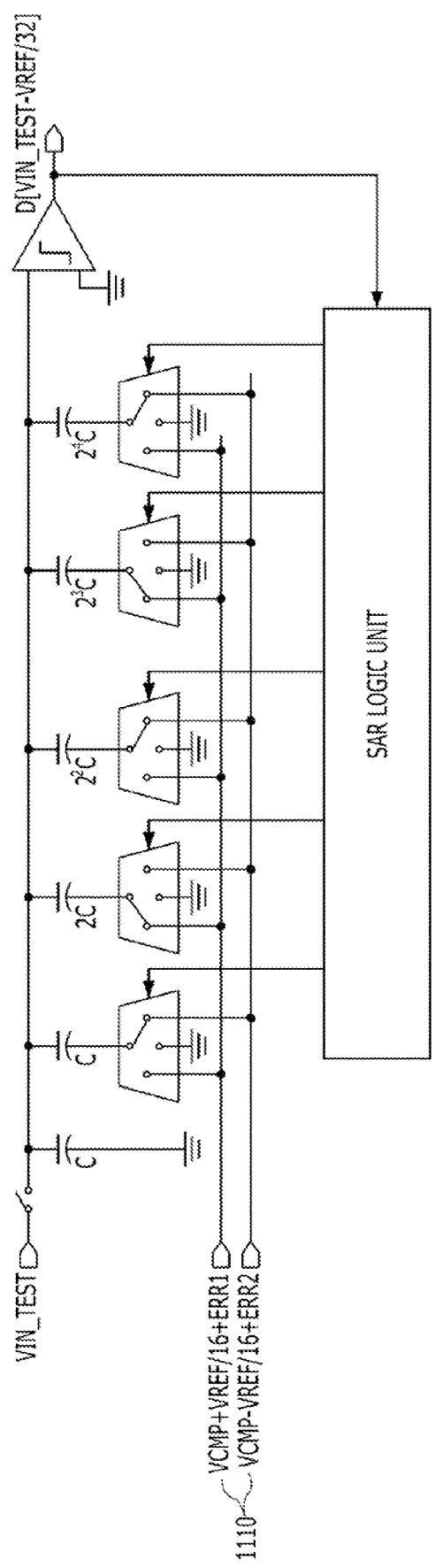
FIG. 11 is a circuit diagram illustrating the SAR analog-to-digital conversion unit, which the lower 6 bits of an output signal of a capacitor DAC, in accordance with the embodiment of the present invention.

FIG. 11 is a circuit diagram illustrating the SAR analog-to-digital conversion unit which converts the lower 6 bits of the output signal of the capacitor DAC in accordance with the embodiment of the present invention. FIG. 11 illustrates the operation of converting the lower 6 bits after the charge redistribution operation of FIG. 10 is completed.

The analog-to-digital (A/D) conversion result of the output signal the VIN_TEST−VREF/32 of the capacitor DAC is stored in a value D[VIN_TEST−VREF/32] through the conversion operation of the lower 6 bits. The reference voltages VCMP+VREF/16 and VCMP−VREF/16 that are used for the conversion operation of the lower 6 bits have errors +ERR1 and +ERR2, which occurs during the generation of the reference voltages, respectively (refer to a reference numeral 1110). When the output signal VIN_TEST−VREF/32 of the capacitor DAC is greater than a value VCMP−VREF/16+ERR2, which is obtained by summing the reference voltage and the error occurring during the generation of the reference voltage, it is between values VCMP+VREF/16+ERR1 and VCMP−VREF/16+ERR2, which is the analog-to-digital conversion range of the SAR analog-to-digital converting apparatus during the operation of converting the lower 6 bits. Therefore, the analog-to-digital (A/D) conversion may be performed on the output signal VIN_TEST−VREF/32.

Herein, what size of the LSB corresponds to the size (which is VREF/16) of the range of the voltages remaining in the capacitor DAC after the conversion of the upper 5 bits during the conversion of the lower 6 bits may be obtained based on the following Equation 3.

$$D[VREF/16] = D[(VIN\_TEST + VREF/32) -$$
$$(VIN\_TEST - VREF/21)]$$
$$D[(VIN\_TEST + VREF/32) - (VIN\_TEST - VREF/32)]$$
$$(VIN\_TEST - VREF/32)]$$

Equation 3

Figure 12:
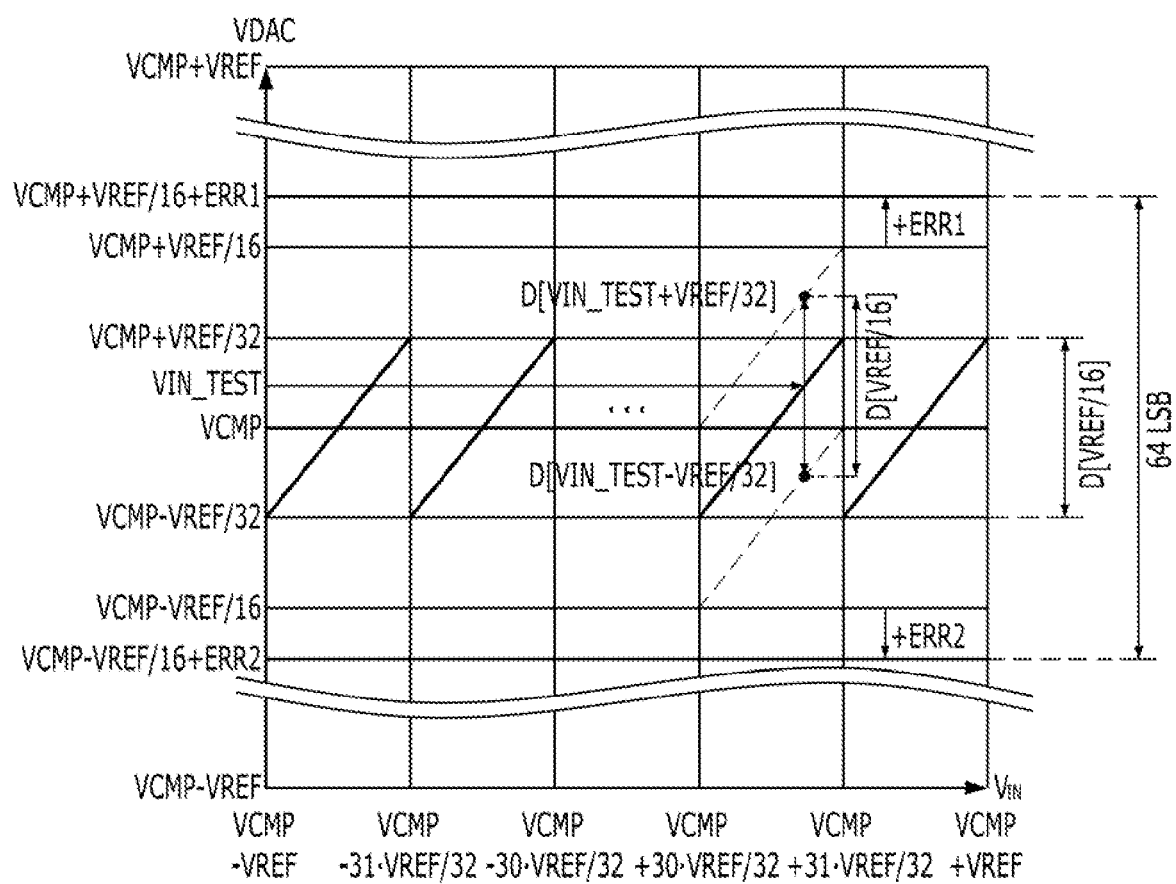
FIG. 12 shows an output signal of the capacitor DAC after the upper 5 bits are converted in the SAR analog-to-digital converting apparatus in accordance with the embodiment of the present invention.

Therefore, as illustrated in FIG. 12, which shows the output signal of the capacitor DAC after the upper 5 bits are converted in the SAR analog-to-digital converting apparatus in accordance with the embodiment of the present invention, the value D[/REF/16] may be obtained based on the difference between D[VIN_TEST+VREF/32] obtained in FIG. 8 and D[VIN_TEST−VREF/32] obtained in FIG. 11.

The error correction unit 530 does a calculation based on the following Equation 4 to obtain the final output signal of the SAR analog-to-digital converting apparatus without a nonlinear error.

$$ADC\_OUT\_10B = D\_UPPER\_5B \times D[VREF/16] + D\_LOWER\_6B$$

Equation 4

Figure 13:
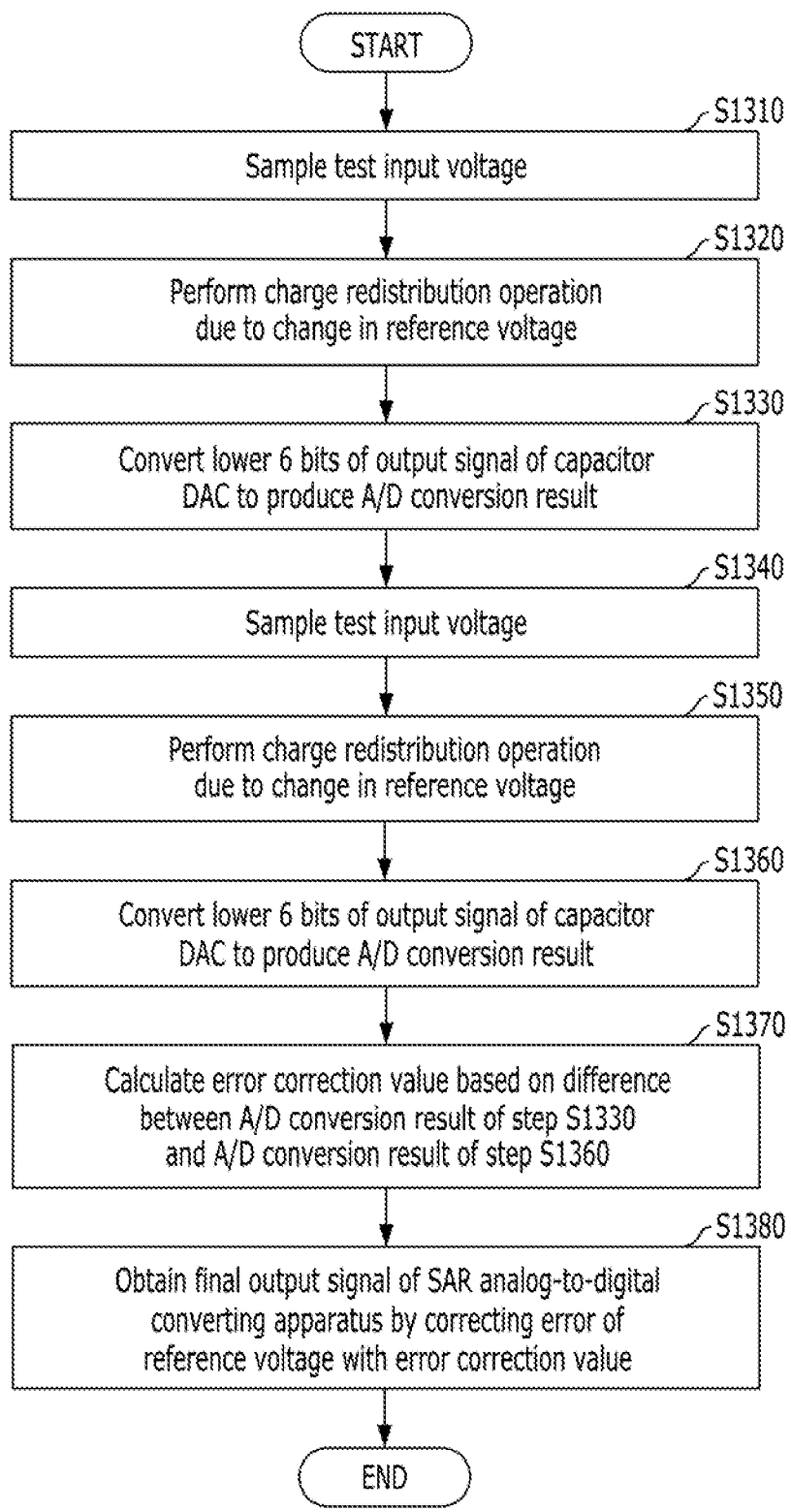
FIG. 13 is a flowchart describing a method for operating an SAR analog-to-digital converting apparatus in accordance with an embodiment of the present invention.

FIG. 13 is a flowchart describing a method for operating an SAR analog-to-digital converting apparatus in accordance with an embodiment of the present invention. Since the specific processes have been described in the above, the operation procedure is briefly described hereafter.

First, the SAR analog-to-digital converting apparatus samples a test input voltage.

Subsequently, in step S1320, the SAR analog-to-digital converting apparatus performs a charge redistribution operation due to a change in a reference voltage.

In step S1330, an operation of converting the lower 6 bits of an output signal of a capacitor DAC is performed to produce an analog-to-digital (A/D) conversion result.

In step S1340, the SAR analog-to-digital converting apparatus samples a test input voltage.

In step S1350, the SAR analog-to-digital converting apparatus performs a charge redistribution operation due to a change in the reference voltage.

Subsequently, in step S1360, an operation of converting the lower 6 bits of an output signal of the capacitor DAC is performed to produce an analog-to-digital (A/D) conversion result.

In step S1370, what size of the LSB corresponds to the size of the range of the voltages remaining in the capacitor DAC after the conversion of the upper 5 bits during the conversion of the lower 6 bits is obtained based on the difference between the A/D conversion result obtained in the step S1330 and the A/D conversion result obtained in the step S1360. Herein, the corresponding size of the LSB is referred to as 'an error correction value'.

Subsequently, in step S1380, the finial output signal of the SAR analog-to-digital converting apparatus is obtained by correcting the error of the reference voltage with the error correction value obtained in the step S1370.

As described above, the nonlinear error of the SAR analog-to-digital converting apparatus in accordance with the embodiment of the present invention may be improved by calculating and correcting the error of the reference voltage, the level of which is controlled to reduce the area of the capacitor DAC.

Figure 14:
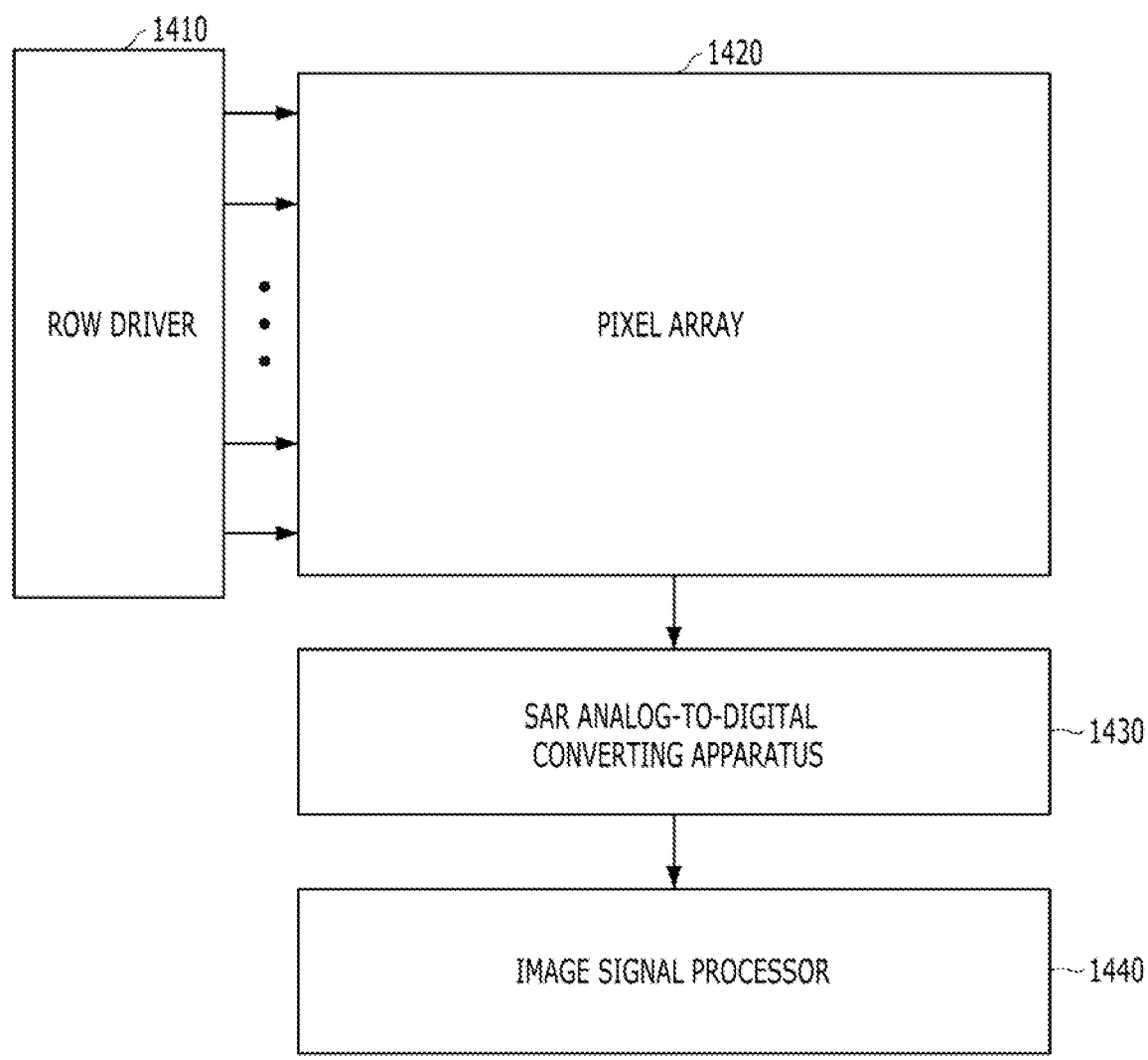
FIG. 14 is a block diagram illustrating a CMOS image sensor using an SAR analog-to-digital converting apparatus in accordance with an embodiment of the present invention.

FIG. 14 is a block diagram illustrating a CMOS image sensor using the SAR analog-to-digital converting apparatus in accordance with an embodiment of the present invention.

Referring to FIG. 14, the CMOS image sensor in accordance with the embodiment of the present invention includes a row driver 1410, a pixel array 1420, the SAR analog-to-digital converting apparatus 1430, and an image signal processor 1440. Since the SAR analog-to-digital converting apparatus 1430 is the same as described above, it is described briefly herein.

First of all, the row driver 1410 drives a pixel that is selected by a row decoder (not shown) among a plurality of pixels in the pixel array 1420.

The pixel array 1420 senses light through an optical device and generates a pixel signal, which is a pixel output signal, corresponding to the sensed light. Among the pixels in the pixel array 1420, the pixel selected by the row decoder outputs a pixel signal. The pixel signal is an analog signal, which is an electrical signal. The pixel signal includes a reset voltage and a signal voltage.

The SAR analog-to-digital converting apparatus 1430 receives the analog pixel signal that is generated in the pixel array 1420 and converts the received analog pixel signal into a digital pixel signal. Herein, the SAR analog-to-digital converting apparatus 1430 sequentially converts the upper N−1 bits and the lower N bits of the pixel output signal that is outputted from the pixel array 1420 depending on a reference voltage calculates an error correction value based on the difference between the bit conversion results of the lower N bits, and corrects the error of the reference voltage with the calculated error correction value. The SAR analog-to-digital converting apparatus 1430 may have the structure of FIG. 5 and operate as described in FIGS. 6 to 13.

The image signal processor 1440 receives an analog-to-digital conversion result from the SAR analog-to-digital converting apparatus 1430 and processes an image signal based on the analog-to-digital conversion result. Since the process is a widely known technology, detailed description on it is omitted herein.

According to an embodiment of the present invention, a nonlinear error of the SAR analog-to-digital converting apparatus may be improved by calculating and correcting an error of a reference voltage generated to control the level of the reference voltage.

Also, according to an embodiment of the present invention, since the error of the generated reference voltage may be calculated and corrected, a two-tier SAP, analog-to-digital converting apparatus occupying a small-area may meet the high-level accuracy in controlling the level of the reference voltage.

As a result, the area of the capacitor digital-to-analog converter may be decreased in accordance with the embodiment of the present invention.

Consequently, a high-definition two-tier SAR analog-to-digital converting apparatus occupying a small-area may be easily realized in accordance with the embodiment of the present invention.

While the present invention has been described with respect to the specific embodiments, it will be apparent to those skilled in the art that various changes and modifications may be made without departing from the spirit and scope of the invention as defined in the following claims.

What is claimed is:

1. A Successive Approximation Register (SAR) analog-to-digital converting apparatus, comprising:
   a reference voltage supply unit suitable for supplying different reference voltages depending on bits of a pixel output signal to be converted;
   an N bit SAR analog-to-digital conversion unit suitable for sequentially converting upper N−1 bits and lower N bits of the pixel output signal by selectively using the reference voltages supplied from the reference voltage supply unit, where N is a natural number; and
   an error correction unit suitable for calculating an error correction value based on a difference between conversion results of the lower N bits, and outputting a 2N−2 bit analog-to-digital conversion result by combining converted upper N−1 bits and converted lower N bits and correcting an error of the reference voltages using the error correction value in the combining.

2. The SAR analog-to-digital converting apparatus of claim 1, wherein the reference voltage supply unit includes:
   a reference voltage generator suitable for outputting the different reference voltages depending on the bits of the pixel output signal to be converted by the N bit SAR analog-to-digital conversion unit; and
   a buffer suitable for transferring the different reference voltages from the reference voltage generator to the N bit SAR analog-to-digital conversion unit.

3. The SAR analog-to-digital converting apparatus of claim 1, wherein the SAR analog-to-digital conversion unit includes:
   a capacitor digital-to-analog converter (DAC) including a plurality of capacitors;
   a comparison unit suitable for performing a comparison operation on an output of the capacitor DAC; and
   a logic unit suitable for generating a control signal to the capacitor DAC in response to an output of comparison unit.

4. The SAR analog-to-digital converting apparatus of claim 3, wherein the SAR analog-to-digital conversion unit samples a test input voltage by supplying a voltage obtained by subtracting a first reference voltage (VREF) from a ground voltage (VCMP) to a first capacitor and supplying the ground voltage (VCMP) to the others, among the capacitors.

5. The SAR analog-to-digital converting apparatus of claim 4, wherein the SAR analog-to-digital conversion unit performs a charge redistribution operation by supplying the ground voltage (VCMP) to the capacitors.

6. The SAR analog-to-digital converting apparatus of claim 5, wherein the SAR analog-to-digital conversion unit converts lower N bits of an output signal of the capacitor DAC by using a second reference voltage (VREF/16).

7. The SAR analog-to-digital converting apparatus of claim 6, wherein the SAR analog-to-digital conversion unit performs a process of sampling the test input voltage by supplying the first capacitor with a voltage obtained by adding the first reference voltage (VREF) to the ground voltage (VCMP) and supplying the others with the ground voltage (VCMP), performing a charge redistribution operation by supplying the capacitors with the ground voltage (VCMP), and converting the lower N bits of the output signal of the capacitor DAC by the second reference voltage (VREF/16).

8. The SAR analog-to-digital converting apparatus of claim 1, wherein the error correction value represents a size of Least Significant Bit (LSB), corresponding to a size of a range of voltages remaining in the capacitor DAC after the upper N−1 bits are converted, in converting the lower N bits.

9. The SAR analog-to-digital converting apparatus of claim 1, wherein the error correction unit outputs the 2N−2 bit analog-to-digital conversion result by adding the converted lower N bits to a value obtained by multiplying the converted upper N−1 bits by the error correction value.

10. A method of operating a Successive Approximation Register (SAR) analog-to-digital converting apparatus, comprising:
    sampling a test input voltage using first reference voltages;
    performing charge redistribution operations through changes in the first reference voltages;

converting lower N bits of an output signal of a capacitor digital-to-analog converter (DAC) to obtain analog-to-digital conversion results using second reference voltages;

obtaining an error correction value based on a difference between the analog-to-digital conversion results; and correcting an error of the second reference voltages with the error correction value.

11. The method of claim 10, wherein the error correction value represents a size of Least Significant Bit (LSB), corresponding to a size of a range of voltages remaining in the capacitor DAC after upper N−1 bits are converted, in converting of the lower N bits.

12. The method of claim 10, wherein in the correcting of the error of the second reference voltages with the error correction value, the error of the second reference voltage is corrected by adding an output of lower N bits of an input signal to a value obtained by multiplying an output of upper N−1 bits of the input signal by the error correction value.

13. A Complementary Metal-Oxide Semiconductor (CMOS) image sensor, comprising:

a pixel array suitable for generating a pixel output signal;

a Successive Approximation Register (SAR) analog-to-digital converting apparatus suitable for sequentially converting upper N−1 bits and lower N bits of the pixel output signal by selectively using reference voltages, calculating an error correction value based on a difference between conversion results of the lower N bits, and correcting an error of the reference voltages by combining converted upper N−1 bits and converted lower N bits using the error correction value; and an image signal processor suitable for performing an image signal processing operation on an analog-to-digital conversion result that is outputted from the SAR analog-to-digital converting apparatus.

14. The CMOS image sensor of claim 13, wherein the SAR analog-to-digital converting apparatus includes:

a reference voltage supply unit suitable for supplying different reference voltages depending on bits of the pixel output signal to be converted;

an N bit SAR analog-to-digital conversion unit suitable for sequentially converting the upper N−1 bits and the lower N bits of the pixel output signal by selectively using the reference voltages supplied from the reference voltage supply unit, where N is a natural number; and an error correction unit suitable for calculating the error correction value based on the difference between the conversion results of the lower N bits, and outputting a 2N−2 bit analog-to-digital conversion result by combining the converted upper N−1 bits and the converted lower N bits and correcting the error of the reference voltages using the error correction value in the combining.

15. The CMOS image sensor of claim 14, wherein the error correction value represents a size of Least Significant Bit (LSB), corresponding to a size of a range of voltages remaining in a capacitor digital-to-analog converter (DAC) after the upper N−1 bits are converted, in converting the lower N bits.

16. The CMOS image sensor of claim 14, wherein the error correction unit outputs the 2N−2 bit analog-to-digital conversion result by adding the converted lower N bits to a value obtained by multiplying the converted upper N−1 bits by the error correction value.

* * * * *